US010862729B1

(12) United States Patent
Rey

(10) Patent No.: US 10,862,729 B1
(45) Date of Patent: Dec. 8, 2020

(54) SYSTEMS AND METHODS FOR DIGITAL CORRECTION WITH SELECTIVE ENABLING IN LOW INTERMEDIATE FREQUENCY (IF) RECEIVERS

(71) Applicant: NXP USA, Inc., Austin, TX (US)

(72) Inventor: Claudio Gustavo Rey, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/596,576

(22) Filed: Oct. 8, 2019

(51) Int. Cl.
*H04L 27/36* (2006.01)
*H04L 27/38* (2006.01)
*H03D 3/00* (2006.01)
*H04L 27/20* (2006.01)

(52) U.S. Cl.
CPC ......... *H04L 27/3863* (2013.01); *H03D 3/009* (2013.01); *H04L 27/2089* (2013.01); *H04L 27/364* (2013.01); *H04L 27/368* (2013.01)

(58) Field of Classification Search
CPC .... H04B 1/0007; H04B 1/0475; H04B 1/525; H03F 2200/336; H04N 5/455; H04L 27/3863; H03D 1/2245; H03D 3/009; H03G 3/3052
See application file for complete search history.

(56) References Cited

U.S. PATENT DOCUMENTS

| | | | |
|---|---|---|---|
| 6,785,529 B2 | 8/2004 | Ciccarelli et al. | |
| 7,839,314 B2 | 11/2010 | Cetin et al. | |
| 7,876,856 B2 | 1/2011 | Elahi et al. | |
| 8,064,542 B1 * | 11/2011 | Lee | H03D 3/009 327/254 |

(Continued)

FOREIGN PATENT DOCUMENTS

| | | |
|---|---|---|
| CN | 101385300 A | 3/2009 |
| EP | 1987646 A1 | 11/2008 |

(Continued)

OTHER PUBLICATIONS

Cetin, E., et al., "Adaptive Compensation of Analog Front-End I/Q Mismatches in Digital Receivers," 2001 IEEE, University of Westminster, Department of Electronic Systems, Applied DSP and VLSI Research Group, London, United Kingdom, pp. IV-370-373.
Chen, C., et al., "Widely Linear Estimation Technique BasedOn Circularity for I/Q Imbalance Compensation in Low-IF Receivers'" 2014 IEEE Workshop on Advanced Research and Technology in Industry Application (WARTIA), pp. 1047-1050.

(Continued)

*Primary Examiner* — Rahel Guarino

(57) ABSTRACT

The embodiments described herein provide systems and methods for digital correction in low intermediate frequency (IF) receivers. Specifically, the embodiments described herein use digital correction techniques that can correct for signal distortions in low IF receivers caused by I-Q imbalance, including both I-Q magnitude imbalance and I-Q phase imbalance. In general, the embodiments described herein are implemented to at least partially cancel an image of a blocking signal in the complex digital signal. Such a cancellation can be implemented to at least partially cancel an image of blocking signal where that image occurs at or near the intermediate frequency. In one embodiment, a corrector is implemented in a low RF receiver and is configured to receive a complex digital signal that includes an image of a blocking signal. Such a low RF receiver can further include a corrector controller to selectively enable the corrector.

20 Claims, 9 Drawing Sheets

(56) References Cited

U.S. PATENT DOCUMENTS

| | | | |
|---|---|---|---|
| 8,233,524 | B2 | 7/2012 | Thirumoorthy |
| 8,340,225 | B2 | 12/2012 | Khoshgard et al. |
| 8,509,298 | B2 | 8/2013 | Hormis |
| 9,042,500 | B1 | 5/2015 | Wong et al. |
| 9,608,679 | B2 | 3/2017 | Cheah et al. |
| 9,712,369 | B2 | 7/2017 | Kim et al. |
| 2009/0058705 | A1 | 3/2009 | Cetin et al. |
| 2017/0126465 | A1 | 5/2017 | Kim et al. |

FOREIGN PATENT DOCUMENTS

| | | |
|---|---|---|
| GB | 603038 A | 6/1948 |
| GB | 2435357 A | 8/2007 |
| JP | 2009526986 A | 7/2009 |
| JP | 6003418 B2 | 10/2016 |
| KR | 20080098526 A | 11/2008 |
| WO | 2007093790 A1 | 8/2007 |

OTHER PUBLICATIONS

Kirei, B.,et al., "Image Rejection Filter Based on Complex LMS Filter for Low-IF Receivers," 50th International Symposium ELMAR-2008, Sep. 2008, Zadar, Croatia, pp. 203-206.

Kirei, B.,et al., "Image Rejection Filter Based on Complex LMS Filter for Low-IF Receivers," 2008 IEEE, Technical University form Cluj-Napoca, Basis of Electronics Department.

Kiss, P., One-Tap Wideband I/Q Copensation for Zero-IF Filters, IEEE Transactions on Circuits and Systems—1. Regular Papers, Col. 51, No. 6, Jun. 2004.

Xu, Y., et al., "A Hybrid Approach to I/Q Imbalance Self-Calibration in Reconfigurable Low-IF Receivers," Institute of Microelectronics, Tsinghua, University, Beijing, China, 2012 IEEE, pp. 552-555.

U.S. Appl. No. 16/596,574, Rey, Claudio Gustavo: "Systems and Methods for Digital Correction in Low Intermediate Frequency (IF) Receivers", filed Oct. 8, 2019.

* cited by examiner

SYSTEMS AND METHODS FOR DIGITAL CORRECTION WITH SELECTIVE ENABLING IN LOW INTERMEDIATE FREQUENCY (IF) RECEIVERS

TECHNICAL FIELD

The embodiments described herein relate generally to wireless communication, and more particularly, relate to low intermediate frequency (IF) receivers.

BACKGROUND

Receivers are used in wireless communication to receive wireless signals and convert those signals into usable information. One type of receiver is generally referred to as a heterodyne receiver. A heterodyne receiver uses frequency mixing to convert the received signals into a new frequency range for processing. In general, a low intermediate frequency (IF) receiver is a type of heterodyne receiver that mixes the received signals to a non-zero low intermediate frequency (IF). After mixing the received signals to the low intermediate frequency the mixed signals can then be demodulated and the transmitted data extracted. Such low IF receivers are increasingly used in a wide variety of applications, including short-wavelength digital communication protocols such as Bluetooth®.

One continuing issue in some low IF receivers is the presence of signal distortions due to I-Q imbalance, where this I-Q imbalance can include both I-Q magnitude imbalance and I-Q phase imbalance. In general, I-Q imbalance occurs due to mismatches in the receiver chain signal paths for the in-phase (I) and quadrature (Q) signals. For example, an I-Q imbalance in a low IF receiver can be created by a mismatch in the analog gain in the I and Q signal paths. Likewise, an I-Q imbalance can be created by the use of delay to generate the Q signals that is not exactly 90 degrees. In each case this I-Q imbalance can result in unwanted signal distortions.

Low-IF receivers are especially sensitive to nearby unwanted transmissions at the image of the IF frequency (i.e., at the −IF location). Such signals may be Bluetooth® signals or others from permitted protocols for the band of operation. Although such signals are typically unintentional, they may block reception of a wanted signal at the IF frequency. Such blocking signals created at or near the −IF location will be referred to herein as −IF blocking signals.

These −IF blocking signals at the −IF location can be translated through the I-Q imbalance and create an unwanted "image" of the blocking signal at the +IF location. Turning now to FIG. 6, a graph 600 illustrates frequency plots of an exemplary desired signal and a blocking signal. Specifically, the frequency plots can represent an exemplary desired signal and blocking signal after mixing in a typical low IF receiver. As was described above, a low IF receiver is a type of heterodyne receiver that mixes received signals to a non-zero low intermediate frequency. In graph 600 the desired signal is shown as having a peak at the low intermediate frequency (i.e., at the +IF location) after mixing.

And as described above, blocking signals may unintentionally interfere with the operation of the receiver. In the example of graph 600 such a blocking signal is shown having a peak near the mirror frequency of the intermediate frequency (i.e., near the −IF location). And as described above, this blocking signal at the −IF location can be translated through the I-Q imbalance and create an unwanted "image" of the blocking signal at the +IF location. In graph 600 an example of such an image of the blocking signal is shown at the +IF location.

This image of the −IF blocking signal that is generated at the +IF location can be particularity problematic for several reasons. Specifically, because the image of the −IF blocking signal is at the +IF location and thus it can be difficult to effectively filter out without also negatively impacting the desired signal. This inability to filter the out the image of the −IF blocking signal can result in a reduction of the signal-to-noise and distortion ratio (SNDR): in technical terms it will de-sensitize the receiver. Thus, there remains a continuing need for improved techniques to mitigate the effect of I-Q imbalance.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

DETAILED DESCRIPTION

Figure 1:
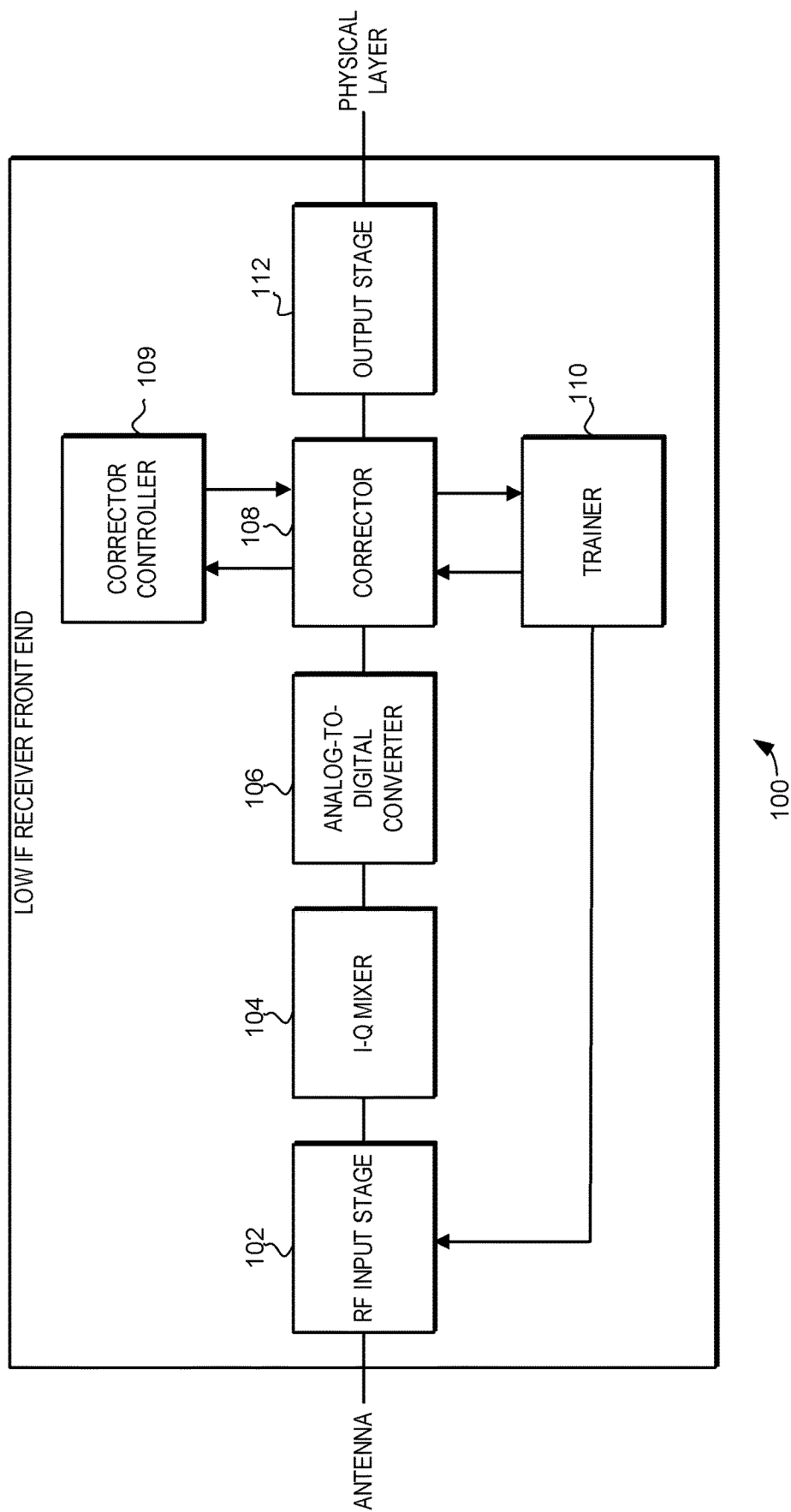
FIG. 1 shows a schematic diagram of a portion of a low intermediate frequency (IF) receiver in accordance with an embodiment.

The embodiments described herein provide systems and methods for digital correction in low intermediate frequency (IF) receivers that can provide improved performance. Specifically, the embodiments described herein use digital correction techniques that can correct for signal distortions in low IF receivers caused by I-Q imbalance, including both I-Q magnitude imbalance and I-Q phase imbalance.

In general, the embodiments described herein are implemented to at least partially cancel an image of a blocking signal in the complex digital signal. Such a cancellation can be implemented to at least partially cancel an image of blocking signal where that image occurs at or near the intermediate frequency (i.e., an image of an −IF blocking signal at occurs at the IF frequency). As such, the embodiments described herein can be applied to a wide variety of radio frequency (RF) applications.

In one embodiment, a corrector is implemented in a low RF receiver and is configured to receive a complex digital signal that includes an image of a blocking signal. Such a corrector can be implemented to at least partially cancel the image of the blocking signal using a cancellation signal.

In some embodiments it can be desirable provide the ability to selectively enable and disable the corrector in response to different wireless scenarios. For example, in some implementations it can be desirable to turn on a corrector to produce a cancellation signal only when certain types of unwanted signals are present over the air. Specifically, because a corrector can sometimes introduce artifacts into the corrected digital signal it can be desirable to only operate the corrector only when the specific unwanted signals the corrector is implemented to cancel are present.

For example, in some implementations a corrector that has been trained to cancel a blocking signal at the image of the IF location (i.e., a blocking signal at the −IF location) can introduce unwanted artifacts in the corrected complex digital signal if the corrector is active when there is no blocking signal at that frequency. This can also be true even when there are blocking signals at other nearby frequencies (e.g., at the −2 IF location, −3 IF location etc.). For all these reasons it can be desirable in some applications to provide the ability to selectively enable and disable the operation of the corrector depending on whether a blocking signal is present at the −IF location.

To facilitate this selective enabling of the corrector a corrector controller can be provided. In general, the corrector controller can be configured to selectively enable the corrector when certain operational conditions are met. For example, the corrector controller can be configured to detect the presence of certain problematic signals and only enable the corrector when those problematic signals are detected.

In one embodiment, the corrector controller can be configured to determine measures of power at an image frequency range around the image of the IF and at a wideband frequency range and to selectively enable the corrector based at least in part on those determinations. Specifically, the corrector controller can be configured to selectively enable the corrector based at least in part on a first measure of power in the complex digital signal (I+jQ) at an image frequency range and a second measure of power in the corrected complex digital signal (I+jQ) at a wideband frequency range. In one embodiment the difference between the first measure of power and the second measure of power is determined and compared to one or more threshold values to determine when the corrector is enabled and disabled.

As described above, in one embodiment a corrector is implemented in a low RF receiver and is configured to receive a complex digital signal that includes an image of a blocking signal. Such a corrector can be implemented to at least partially cancel the image of the blocking signal using a cancellation signal. Such a low RF receiver can further include a trainer configured to train the corrector to generate the cancellation signal. In such an embodiment the corrector can use the generated cancellation signal to at least partially cancel images of blocking signals that are at or near the image of the intermediate frequency.

So implemented, the systems and methods described herein can provide improved performance in low IF receivers. Specifically, in some embodiments the systems and methods can reduce signal distortions caused by I-Q imbalance and thus increase the signal-to-noise and distortion ratio (SNDR) of the low IF receiver.

Turning now to FIG. 1, an exemplary low IF receiver front end 100 in accordance with the embodiments described herein is illustrated schematically. In general, low IF receivers use a non-zero low intermediate frequency in the processing of received RF signals. Specifically, low IF receivers use frequency mixing to shift the received RF signals to an intermediate frequency as part of a signal processing technique that is commonly referred to as heterodyning. For example, suitable low IF receivers can shift the received RF signals to an IF frequency of typically a few MHz or lower frequencies. As specific examples, the low IF frequencies for some applications can be between 1-3 MHz, while other applications may use low IF frequencies between 100-300 kHz. Those intermediate frequency signals can then be processed and applied to a detector that extracts the transmitted digital data. Such low IF receivers are used in a wide variety of applications, including in digital communication devices that implement a variety of digital communication protocols. Finally, it should be noted that FIG. 1 is a simplified representation of such a receiver front end, and typical implementations of low IF receiver front ends would typically include additional elements and features not shown in FIG. 1.

The low IF receiver front end 100 illustrated in FIG. 1 includes an RF input stage 102, an I-Q mixer 104, an analog-to-digital converter (ADC) 106, a corrector 108, a corrector controller 109, a trainer 110, and an output stage 112. In general, the low IF receiver front end 100 receives RF signal energy from an antenna, processes the RF signal energy to extract digital data from the RF signal energy, and outputs the digital data to the remaining elements of the physical layer (e.g., acquisition elements and demodulation elements) in whatever system or device is implemented to receive the digital data. The low IF receiver front end 100 is an example of a receiver front end that uses low IF signal processing techniques, and thus can be implemented in a variety of devices and used in a variety of applications for which low IF architectures are appropriate. For example, the low IF receiver front end 100 can be implemented for use in digital communication devices in Bluetooth® wM-Bus®, SigFox®. Z-Wave®, 802.15.4 and other communication standards.

In this illustrated embodiment the RF input stage 102 receives signal energy from the antenna, amplifies the received signal energy, and passes the amplified signals to the I-Q mixer 104. The signal energy received by the RF input stage 102 includes quadrature signals. Thus, the signal energy includes signals in both I and Q channels where the I and Q channels have a quadrature (i.e., 90 degree) relative phase difference.

In a typical implementation the RF input stage 102 could include a suitable impedance matching network coupled to the antenna and a suitable low noise amplifier (LNA). Other elements in the RF input stage 102 could include power detectors, filters and other gain control stages. As will be described in greater detail below, in the embodiments described herein the RF input stage 102 is also configured to receive a training signal from the trainer 110, where the training signal will be used to train the corrector 108.

The I-Q mixer 104 receives the amplified signals from the RF input stage 102 and down mixes both the I and Q channels to a suitable low intermediate frequency. To facilitate this the I-Q mixer 104 uses quadrature mixing signals (i.e., separate I and Q mixing signals) implemented to ideally have an identical frequency and a precise 90-degree relative phase shift. In one embodiment, these separate I and Q mixing signals can be generated through a voltage-controlled oscillator (VCO) controlled by a phase-locked loop to generate quadrature (90-degree) components.

The I-Q mixer 104 thus will generate I and Q output signals, with each of the I and Q output signals having a frequency centered at the low intermediate frequency and having a phase difference of approximately 90 degrees. In some embodiments these I and Q output signals can be filtered or otherwise processed. For example, these I and Q output signals can be applied to a suitable complex band pass filter configured to filter around the intermediate frequency. These I and Q output signals can be then be passed to the ADC 106.

It should be noted in an ideal implementation the I and Q mixing signals would be separated by precisely 90 degrees. Furthermore, the resulting I and Q output signals of the I-Q mixer would also ideally have equal amplitudes. Furthermore, any filters or other elements would also be ideally be precisely matched. However, in real world implementations there will always be some phase error and amplitude mismatch, with the result of this phase error and amplitude mismatch being an I-Q imbalance in the I and Q output signals that are applied to the ADC 106.

The ADC 106 is configured to receive the I and Q output signals and convert the I and Q output signals to a complex digital signal, where the complex digital signal is in the form of (I+jQ). As such, the ADC 106 can be implemented with any suitable analog-to-digital conversion device or technique. For example, the ADC 106 can be implemented with a Nyquist 10-bit (for example) converter based on a SAR architecture. After some processing (such as decimation and DC offset cancellation, the complex digital signal (I+jQ) is then outputted to the corrector 108.

In general, the corrector 108 is implemented to receive the complex digital signal (I+jQ) and at least partially cancel an image of a blocking signal in the complex digital signal (I+jQ). Specifically, the corrector 108 is configured to at least partially cancel an image of a blocking signal in the complex digital signal (I+jQ) by generating an appropriate cancellation signal. This cancellation signal, when applied to the complex digital signal (I+jQ), will at least partially cancel the image of the blocking signal. The corrector 108 thus generates a corrected complex digital signal which is outputted to the output stage 112. Several detailed examples of how the corrector 108 can be implemented will be discussed below with reference to FIGS. 2-5.

In general, the corrector controller 109 is configured to selectively enable the corrector 108 when certain operational conditions are met. For example, the corrector controller 109 can be configured to detect the presence of certain problematic signals and only enable the corrector when those problematic signals are detected. In one embodiment, the corrector controller 109 can be configured to determine measures of power at an image frequency range around the image of the IF and at a wideband frequency range and to selectively enable the corrector based at least in part on those determinations. Specifically, the corrector controller 109 can be configured to selectively enable the corrector based at least in part on a first measure of power in the complex digital signal (I+jQ) at an image frequency range and a second measure of power in the corrected complex digital signal (I+jQ) at a wideband frequency range. In one embodiment the difference between the first measure of power and the second measure of power is determined and compared to one or more threshold values to determine when the corrector is enabled and disabled. Examples of such a corrector controller 109 will be discussed in greater detail with reference to FIGS. 7-9.

In general, the trainer 110 is configured to train the corrector 108 to produce the cancellation signal needed to cancel an image of a blocking signal and generate a corrected complex digital signal. To facilitate this, the trainer 110 is coupled to both the input stage 102 and the corrector 108. During training the trainer 110 generates a trainer signal that is used to train the corrector 108. For example, the trainer 110 can be configured to generate and apply the training signal to the RF input stage 102. From there, the training signal propagates through the I-Q mixer 104 and the ADC 106 and is applied to the corrector 108 as a complex digital training signal. There, the complex digital training signal is used to train the corrector 108. Several detailed examples of such a training procedure will be described in greater detail below.

As described above, the corrector 108 generates a corrected complex digital signal which is outputted to the output stage 112. In general, the output stage 112 can be implemented to perform any additional output processing of the corrected complex digital signal needed by the low IF receiver front end 100. Thus, the particular processing operations performed by the output stage 112 would depend on the application for the low IF receiver front end 100 is implemented. As some examples, the output stage 112 can typically include a digital intermediate frequency mixer that is used to downmix the corrected complex digital signal to the baseband frequency. When downmixed to baseband frequency the complex digital signal can then be demodulated and processed to extract the digital data. To facilitate this extraction of the digital data the output stage 112 can include additional processing elements such as an automatic digital gain control decimation, down mixing, and baseband and channel filtering. The extracted digital data can then be outputted to whatever system or device is implemented to receive the digital data.

In some embodiments, the corrector 108 includes a complex gain adjuster, and the trainer 110 includes a complex gain trainer configured to train the complex gain adjuster. As will be described in greater detail below, this complex gain adjuster can be implemented with a multiplier used to implement the selected gain. Examples of such embodiment will be discussed below with reference to FIGS. 2 and 5.

Also, in such an embodiment the complex gain trainer can comprise a squaring function, a gain function and an accumulator configured to receive an output of the corrector 108, and where an output of the accumulator is provided to configure an amount of complex gain provided by the complex gain adjuster based at least in part on the output of the corrector 108. A detailed example of such an embodiment will be discussed with reference to FIG. 3 below.

In one embodiment, the corrector 108 includes a complex conjugate operator and a predictor following the complex conjugate operator in the corrector 108. In such an embodiment, the trainer 110 can include a training signal generator and a predictor trainer. In such an embodiment the training signal generator is configured to apply a training signal to the RF input stage 102 and the predictor trainer is configured to train the predictor with the training signal applied to the RF input stage 102. An example of such an embodiment will be described in greater detail below with reference to FIG. 2. In one such embodiment the predictor can be implemented with a complex filter and an adjustable delay.

In one embodiment, the predictor includes a complex filter and an adjustable delay. Specifically, the complex filter can be implemented with a complex finite impulse response (FIR) filter having two taps or three taps.

In another embodiment, the corrector 108 includes a complex conjugate operator and an equalizer preceding the complex conjugate operator in the corrector 108. In such an embodiment, the trainer 110 can include a training signal generator and an equalizer trainer. In such an embodiment the training signal generator is configured to apply a training signal to the RF input stage 102 and the equalizer trainer is configured to train the equalizer with the training signal applied to the RF input stage 102. An example of such an embodiment will be described in greater detail below with reference to FIG. 4.

In one embodiment, the equalizer includes a complex filter and an adjustable delay. Specifically, the complex filter can be implemented with a complex finite impulse response (FIR) filter having two taps or three taps.

Figure 2:
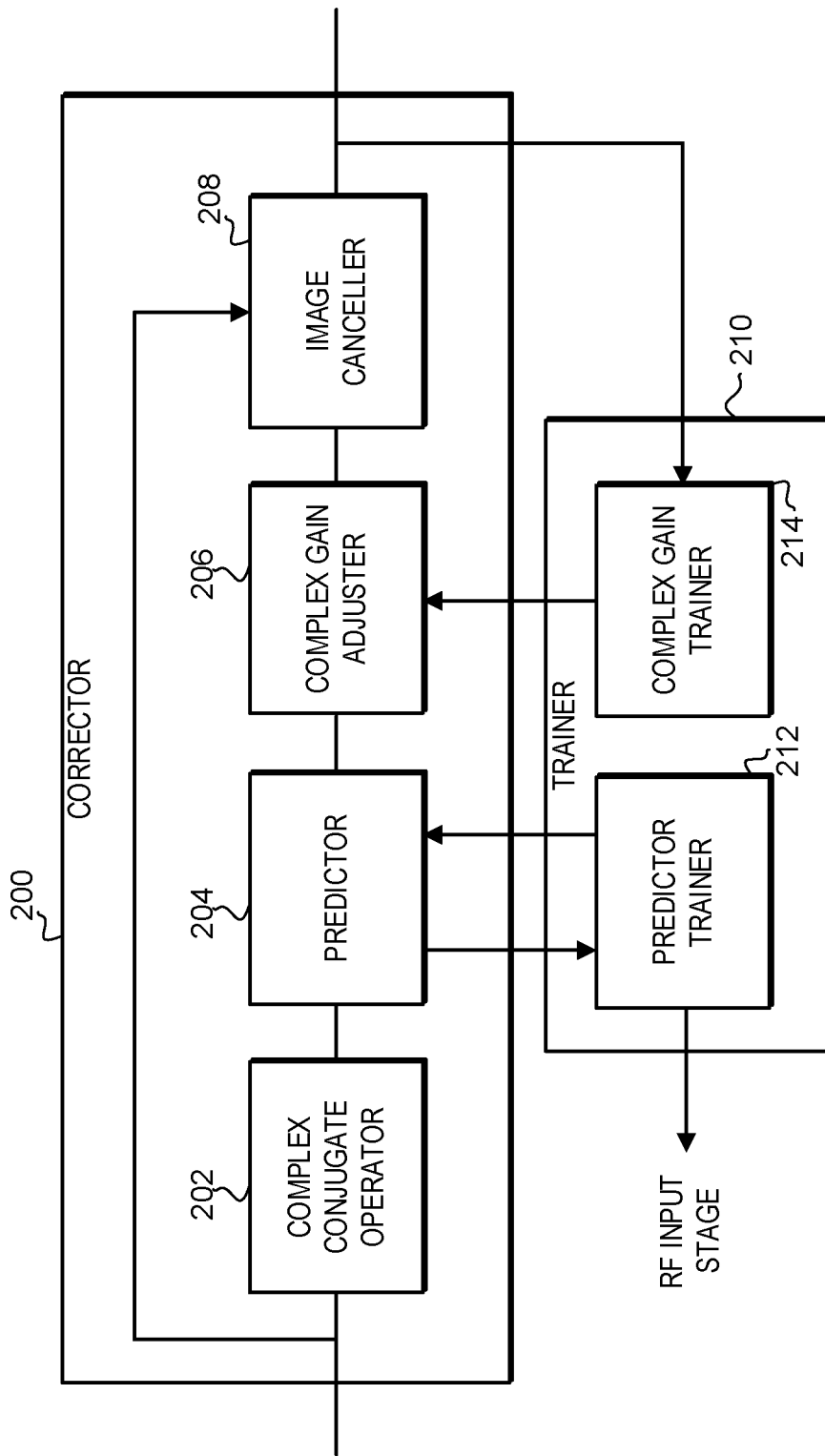
FIG. 2 shows a schematic diagram of a corrector in accordance with an embodiment.

Turning now to FIG. 2, an exemplary corrector 200 and trainer 210 in accordance with the embodiments described herein is illustrated schematically. The corrector 200 is an example of the type of corrector that can be used in low IF receiver front end 100 illustrated in FIG. 1. As was described above, the corrector 200 is implemented receive a complex digital signal (I+jQ) and at least partially cancel an image of a blocking signal in the complex digital signal by generating an appropriate cancellation signal. This cancellation signal, when applied to the complex digital signal, will at least partially cancel the image of the blocking signal. The corrector 200 thus through image cancellation generates a corrected complex digital signal.

Likewise, the trainer 210 is an example of the type of trainer that can be used in low IF receiver front end 100 illustrated in FIG. 1. Again, the trainer 210 is configured to train the corrector 200 to produce the cancellation signal needed to cancel an image of a blocking signal and generate a corrected complex digital signal.

In the example of FIG. 2 the corrector 200 includes a complex conjugate operator 202, a predictor 204, a complex gain adjuster 206 and an image canceller 208. Notably, in this embodiment the complex conjugate operator 202 comes before the predictor 204. The trainer 210 in this example includes a predictor trainer 212 and a complex gain trainer 214.

In general, the predictor 204 and the complex gain adjuster 206 are both used together to generate a cancellation signal that will reduce the effects of distortion in the complex digital signal by cancelling the image of a blocking signal in a complex digital signal. However, the predictor 204 and the complex gain adjuster 206 are implemented to use different techniques and to be trained at different intervals. Specifically, the predictor 204 is implemented with computationally intensive complex filtering techniques that can require significant time to train. Thus, the predictor 204 is implemented to be trained periodically when the device is offline or otherwise not being used for receiving RF signals. For example, the predictor 204 can be implemented to be trained only once (e.g., at initial device assembly or first start up) or at predetermined intervals (e.g., during selected device restarts).

In contrast, the complex gain adjuster 206 is implemented to use less computationally intensive gain adjustment techniques and can be trained much faster than the predictor. This allows the complex gain adjuster 206 to adjust and optimize the cancellation signal in response to frequent operational changes. For example, the complex gain adjuster 206 can be configured to train before the arrival of every packet to optimize the cancellation signal. Thus, taken together the predictor 204 and the complex gain adjuster 206 can provide an effective cancellation signal for cancelling the image of a blocking signal in a complex digital signal.

During operation, the complex conjugate operator 202 receives the complex digital signal and generates the complex conjugate of the signal. Described mathematically, this operation changes the sign of the Q component of the complex digital signal. This operation generates an image frequency much alike the undesired distortion. The complex conjugate of the complex digital signal is then passed to the predictor 204.

In general, the predictor 204 receives the complex conjugate and filters from the complex conjugate the effects of distortion resulting from the image of the −IF blocking signal. To perform this filtering the predictor 204 can be implemented with a complex filter and an adjustable delay. In general, the complex filter and adjustable delay are implemented to shape and delay-match the conjugated signal in order to generate a cancellation signal of opposite polarity to the image of the −IF blocking signal. In such an embodiment the parameters of the complex filter and the adjustable delay are determined during off-line training to generate a cancellation signal from the complex conjugate that can be used to cancel the distortions caused by the image of the −IF blocking signal. It should be noted that this training is done solely with the use of a training signal provided by the trainer 210, as will be described in greater detail below.

In one embodiment, the complex filter in the predictor 204 is implemented with a complex finite impulse response (FIR) filter, where the coefficients of the FIR filter are complex numbers. For example, the complex filter can comprise a two-tap complex FIR filter that includes two complex coefficients. Such a two-tap complex FIR filter can be implemented to effectively generate the cancellation signal when combined with the adjustable delay. In other embodiments, a three-tap complex FIR filter can instead be used, although such an embodiment will require significantly more time to train the filter and will increase power consumption. Of course, these are just non-limiting examples, and other types of complex filters can be used to implement the predictor 204.

In one embodiment, the complex filter is implemented to have a near zero between the IF frequency and zero frequency and a characteristic V-shape in the region of interest. Note that such a complex filter will also create artifacts for blockers away from the −IF region, such artifacts can be minimized through further processing of the cancellation signal through a filter centered at the IF frequency.

In general, the adjustable delay in the predictor 204 is provided to make the cancellation signal time-matched with the complex digital signal at the image canceller 208. The adjustable delay when chosen carefully can simplify the implementation of the predictor 204. Specifically, the use of such an adjustable delay can greatly reduce the number of coefficients required in the complex filter, and thus can greatly simplify the training of the complex filter. In principle, the amount of delay is configured as to compensate for the group delay of the front-end analog filters. Specifically, the amount of delay provided by the adjustable delay would be determined during training of the predictor 204.

The output of the predictor 204 is passed to the complex gain adjuster 206. In general, the complex gain adjuster 206 is implemented to provide a relatively fine gain and phase adjustment to the cancellation signal during operation of the low IF receiver. Thus, the complex gain adjuster 206 can provide a continuous, real time adjustment to the cancellation signal in a way that can compensate for environmental and other changes to the system. In one embodiment, the complex gain adjuster 206 can be implemented with a digital complex multiplier that multiplies the incoming cancellation signal by a complex value. This digital complex multiplier can thus provide a selected amount of magnitude and gain control to the incoming cancellation signal, and that amount can be retrained relatively often. For example, the amount of gain can be retrained before turning on the reception of an expected incoming packet if environmental conditions have changed or enough time has passed.

The output of the complex gain adjuster 206 is provided to the image canceller 208. There, the cancellation signal generated by the complex conjugate operator 202, the predictor 204 and the complex gain adjuster 206 is combined with the original complex digital signal to generate a corrected complex digital signal. For example, the cancellation signal can be summed to the complex digital signal using a complex summer to generate the corrected complex digital signal. This corrected complex digital signal can then be provided to the output stage (e.g., output stage 112, FIG. 1).

As noted above, in this embodiment the complex conjugate operator 202 comes before the predictor 204. This configuration facilities relatively easy training of the predictor 204 to provide the desired correction. It should be noted that the conjugate function provided by the complex conjugate operator 202 is a very nonlinear function which "flips" the spectrum in order to prepare the signal for the cancellation process provided by the predictor 204. This nonlinearity prevents the complex conjugate operator 202 from being commuted with the predictor 204 by changing their relative position in the corrector 200 without a significant change to the operation of the corrector 200. Instead, when the position of the complex conjugate operator 202 is commuted the "predictor" will not function as a predictor can instead be viewed to function as a front-end filter equalizer. Such an embodiment will be described in greater detail below with reference to FIG. 4.

As was described above, the predictor 204 and the complex gain adjuster 206 are used together to generate a cancellation signal that can be used to reduce the effects of distortion in the complex digital signal cancelling the image of a blocking signal in a complex digital signal. And again, the predictor 204 and the complex gain adjuster 206 are implemented to use different techniques and to be trained at different intervals. To facilitate these different training techniques the trainer 210 includes a predictor trainer 212 and a complex gain trainer 214.

The predictor trainer 212 is coupled to the predictor 204 and the RF input stage (e.g., RF input stage 102, FIG. 1). As described above, the predictor 204 is implemented with computationally intensive complex filtering techniques that can require significant time to train, and thus the predictor trainer 212 is applied relatively rarely (e.g., during an initialization procedure) or at predetermined intervals (e.g., during selected device restarts) to train the predictor 204 when the low IF receiver is offline or otherwise not being used for receiving RF signals.

Thus, when the low IF receiver is not being used for receiving RF signals the predictor trainer 212 can generate a training signal and apply that training signal to the input stage of the low IF receiver front end. As one example, the training signal can be generated by an auxiliary phase locked loop in the predictor trainer 212 and then provided to a low noise amplifier (LNA) in the RF input stage. At the same time the main input to the LNA can be set to a high impedance such that only the training signal is amplified by the LNA. The effects of this amplified training signal will then propagate through the low IF receiver front end (e.g., through the I-Q mixer 104, ADC 106) until they reach the corrector (e.g., corrector 108, 200). There, the training signal can be used to train the predictor 204.

An example training procedure performed by the predictor trainer 212 is as follows. First, the training signal received at the input of the predictor 204 is saved off-line. Second, the saved training signal and its conjugate are then filtered with a high order filter to de-emphasize the components at −IF. Third, the filtered training signal and the filtered conjugate of the training signal can then be used to determining the coefficients of the complex filter response equation. For example, in the cased of a FIR complex filter the filter response x(n) can be defined as:

$$x(n)=a_0 xc(n-k)+a_1 xc(n-1-k)+a_2 xc(n-2-k)+\varepsilon_n$$

where $a_0$, $a_1$, and $a_2$ are complex coefficients and the k is an offset value that represents the group delay. According to this method, the complex coefficients $a_0$, $a_1$, and $a_2$ can be determined with a least-squares fit using the filtered training signal as output and the filtered conjugate as input. Likewise, the time offset value k can be optimized with trial and error by doing the least-squares fit for several values of k and choosing the k that gives the best performance overall. Once so determined the complex coefficients and the k value can be saved and used by the predictor 204. Note that while the filter response equation above shows three coefficients ($a_0$, $a_1$, and $a_2$), other embodiments may use a different number of coefficients to provide a good fit.

The complex gain trainer 214 is likewise coupled to the complex gain adjuster 206 and the output of the image canceller 208. As described above, the complex gain adjuster 206 is implemented to use less computationally intensive gain adjustment techniques and can train much faster and more often. This allows the complex gain adjuster 206 to adjust and optimize the cancellation signal in response to changes due to temperature and aging. It should be noted that the complex gain adjuster 206 is thus trained only after the predictor 204 has been trained. Thus, the complex gain adjuster 206 can be used to maintain the cancellation signal near optimal with environmental changes while the predictor 204 values predict intrinsic behavior that does not need as much adaptation.

The complex gain trainer 214 is coupled to the complex gain adjuster 206 and the output of the image canceller 208. In general, the complex gain trainer 214 is based on the DC component cancellation of the square of the output of the image canceller. The simplicity and stability of this algorithm facilitates relatively quick training that can be repeatedly performed as environmental conditions change. This quick adaptation may be done by waking up the receiver slightly earlier then required and performing a quick adaptation before allowing the reception of external signals.

Figure 3:
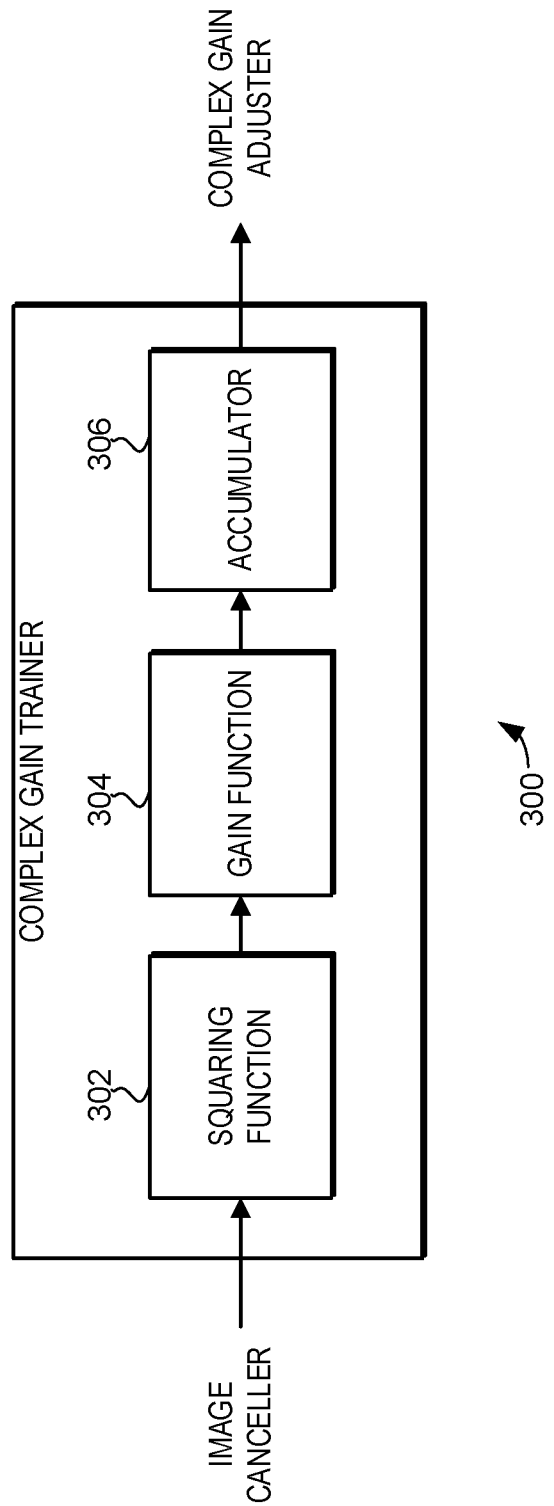
FIG. 3 shows a schematic diagram of a trainer in accordance with an embodiment.

Turning now to FIG. 3, one embodiment of complex gain trainer 300 is illustrated in greater detail. The complex gain trainer 300 is an example of the type of complex gain trainer that can be implemented in the trainer (e.g., trainer 110, 210, 410). In this embodiment the complex gain trainer 300 includes a squaring function 302, a gain function 304, and an accumulator 306. The complex gain trainer 300 receives the corrected complex digital signal from the output of the image canceller (e.g., image canceller 208) and outputs to the complex gain adjuster (e.g., complex gain adjuster 206). It should be noted that the complex gain trainer 300 is architected as part of a feedback loop that is designed to minimize DC components in the feedback loop and trains the complex gain adjuster to cancel the image of the blocker and mitigate the effects of IQ imbalance.

Specifically, the complex gain trainer 300 receives a feedback of the corrected complex digital signal from the image canceller at the squaring function 302. The squaring function 302 squares this corrected complex digital signal in the complex domain. Because the squaring function 302 performs the squaring in the complex domain it generates a 2*IF component and a DC component. The squared corrected complex digital signal is then passed to the gain function 304 and then to the accumulator 306.

In general, the squared corrected complex digital signal is accumulated by the accumulator 306 while the gain function 304 controls the adaptation rate of the feedback loop. The cancellation loop uses this complex value accumulator 306 as an integrative control to accurately generate a cancellation signal for image of the −IF blocking signal. In this operation the accumulator 306 effectively filters out the 2*IF component and integrates the DC component.

Note that the cancellation loop can be made stable by keeping the loop gain low enough. Also, as the cancellation loop is a relatively simple first order loop it can train the complex gain adjuster relatively fast.

Returning to FIG. 2, the corrector 200 so implemented and trained with the trainer 210 can thus receive a complex digital signal and at least partially cancel an image of a blocking signal in the complex digital signal by generating an appropriate cancellation signal. And thus the corrector 200 can provide improved performance in low IF receivers by reducing signal distortions caused by I-Q imbalance and thus increase the signal-to-noise and distortion ratio (SNDR) during normal packet reception.

Figure 4:
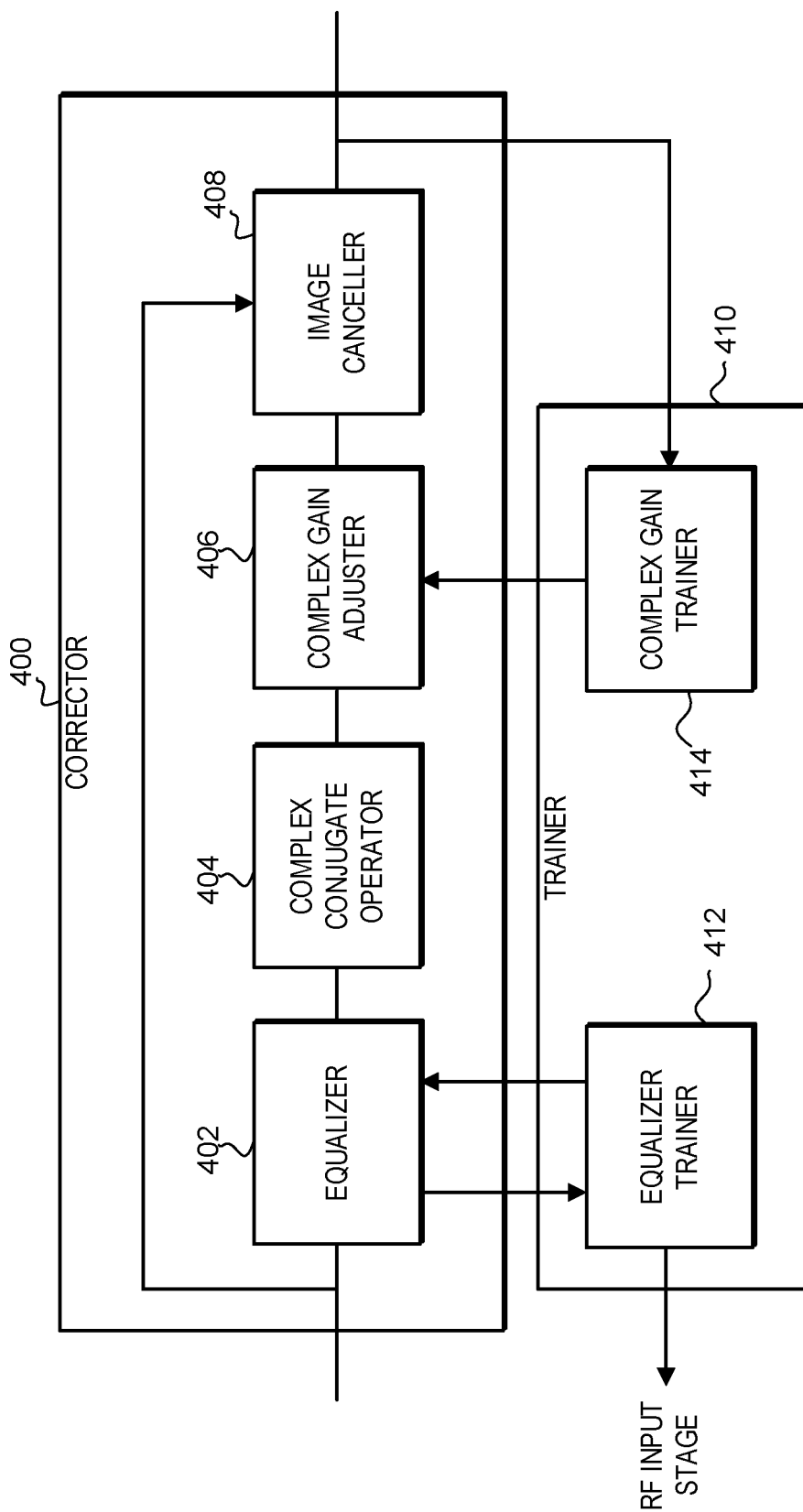
FIG. 4 shows a schematic diagram of a corrector in accordance with another embodiment.

Turning now to FIG. 4, another exemplary corrector 400 and trainer 410 in accordance with the embodiments described herein is illustrated schematically. The corrector 400 is another example of the type of corrector that can be used in low IF receiver front end 100 illustrated in FIG. 1. In general, the corrector 400 differs from the corrector 200 in FIG. 2 in that it utilizes an equalizer before the complex conjugate operator rather than a predictor after the complex conjugate operator.

Like the corrector 200, the corrector 400 is implemented receive a complex digital signal (I+jQ) and at least partially cancel an image of a blocking signal in the complex digital signal by generating an appropriate cancellation signal. This cancellation signal, when applied to the complex digital signal, will at least partially cancel the image of the blocking signal.

Likewise, the trainer 410 is an example of the type of trainer that can be used in low IF receiver front end 100 illustrated in FIG. 1. Again, the trainer 410 is configured to train the corrector 400 to produce the cancellation signal needed to cancel an image of a blocking signal and generate a corrected complex digital signal.

In the example of FIG. 4 the corrector 400 includes an equalizer 402, a complex conjugate operator 404, a complex gain adjuster 406 and an image canceller 408. Notably, in this embodiment the equalizer 402 comes before the complex conjugate operator 404. The trainer 410 in this example includes an equalizer trainer 412 and a complex gain trainer 414.

In general, the equalizer 402 and the complex gain adjuster 406 are both used together to generate a cancellation signal that will reduce the effects of distortion in the complex digital signal by cancelling the image of a blocking signal in a complex digital signal. However, like the predictor 204 described above, the equalizer 402 is implemented to use different techniques and to be trained at different intervals compared to the complex gain adjuster 406. Specifically, the equalizer 402 is implemented with computationally intensive complex filtering techniques that can require significant time to train. Thus, the equalizer 402 is implemented to be trained periodically when the device is offline or otherwise not being used for receiving RF signals. For example, the equalizer 402 can be implemented to be trained only once (e.g., during an initialization procedure) or at predetermined intervals (e.g., during selected device restarts).

In contrast, the complex gain adjuster 406 is again implemented to use less computationally intensive gain adjustment techniques and can be trained much faster than the predictor. This allows the complex gain adjuster 406 to adjust and optimize the cancellation signal in response to frequent operational changes. For example, the complex gain adjuster 406 can be configured to train before the arrival of every packet to optimize the cancellation signal. Thus, taken together the equalizer 402 and the complex gain adjuster 406 can provide an effective cancellation signal for cancelling the image of a blocking signal in a complex digital signal.

In general, the equalizer 402 receives the complex digital signal filters from the complex digital signal the effects of distortion resulting from the image of the −IF blocking signal. To perform this filtering the equalizer 402 can be implemented with a complex filter and an adjustable delay. In general, the complex filter and adjustable delay are again implemented to shape and delay-match the conjugated signal in order to generate a cancellation signal of opposite polarity to the image of the −IF blocking signal. In such an embodiment the parameters of the complex filter and the adjustable delay are determined during training to generate a cancellation signal from the complex digital signal that can be used to cancel the distortions caused by the image of the −IF blocking signal. It should be noted that this training is done solely with the use of a training signal provided by the trainer 410, as will be described in greater detail below.

In one embodiment, the complex filter in the equalizer 402 is implemented with a complex finite impulse response (FIR) filter, where the coefficients of the FIR filter are complex numbers. For example, the complex filter can comprise a two-tap complex FIR filter that includes two complex coefficients. Such a two-tap complex FIR filter can be implemented to effectively generate the cancellation signal while not requiring an excessive amount of training time. In other embodiments, a three-tap complex FIR filter can instead be used, although such an embodiment will require significantly more time to train the filter and will increase power consumption. Of course, these are just non-limiting examples, and other types of complex filters can be used to implement the equalizer 402.

In one embodiment, the complex filter is implemented to have a near zero between the IF frequency and zero frequency and a characteristic V-shape in the region of interest. Note that such a complex filter will also create artifacts for blockers away from the −IF region, such artifacts can be minimized through further processing of the cancellation signal through a filter centered at the IF frequency.

In general, the adjustable delay in the equalizer 402 is provided to make the cancellation signal time matched with the complex digital signal at the image canceller 408. The use of such an adjustable delay can simplify the implementation of the equalizer 402. Specifically, the use of such an adjustable delay can greatly reduce the number of coefficients required in the complex filter, and thus can greatly simplify the training of the complex filter. In principle, the amount of delay is configured is to compensate for the group delay of the front end analog filters. Specifically, the amount of delay provided by the adjustable delay would be determined during training of the equalizer 402.

The output of the equalizer 402 is passed to the complex conjugate operator 404, which generates the complex conjugate of the signal. Described mathematically, this operation changes the sign of the Q component of the complex digital signal. This operation generates an image frequency much alike the undesired distortion. The complex conjugate of the complex digital signal is then passed to the complex gain adjuster 406.

In general, the complex gain adjuster 406 is again implemented to provide a relatively fine gain and phase adjustment to the cancellation signal during operation of the low IF receiver. Thus, the complex gain adjuster 406 can provide a continuous, real time adjustment to the cancellation signal in a way that can compensate for environmental and other changes to the system. In one embodiment, the complex gain adjuster 406 can be implemented with a digital complex multiplier that multiplies the incoming cancellation signal by a complex value. This digital complex multiplier can thus provide a selected amount of magnitude and gain control to the incoming cancellation signal, and that amount can be retrained relatively often. For example, the amount of gain can be retrained before turning on the reception of an expected incoming packet if environmental conditions have changed or enough time has passed.

The output of the complex gain adjuster 406 is provided to the image canceller 408. There, the cancellation signal generated by the equalizer 402, the complex conjugate operator 404, and the complex gain adjuster 406 is combined with the original complex digital signal to generate a corrected complex digital signal. For example, the cancellation signal can be summed to the complex digital signal using a complex summer to generate the corrected complex digital signal. This corrected complex digital signal can then be provided to the output stage (e.g., output stage 112, FIG. 1).

As noted above, in this embodiment the equalizer 402 comes before the complex conjugate operator 404. It should again be noted that the conjugate function provided by the complex conjugate operator 404 is a very nonlinear function which "flips" the spectrum after the cancellation process provided by the equalizer 402. This nonlinearity, again, prevents the complex conjugate operator 404 from being commuted with the equalizer 402 by changing their relative position in the corrector 400 without a significant change to the operation of the corrector 400. While this embodiment can provide effective cancellation when properly implemented, it may also be significantly more difficult to train the equalizer 402 compared to the training of the predictor 204 described above.

As was described above, the equalizer 402 and the complex gain adjuster 206 are used together to generate a cancellation signal that can be used to reduce the effects of distortion in the complex digital signal cancelling the image of a blocking signal in a complex digital signal. And again, the equalizer 402 and the complex gain adjuster 206 are implemented to use different techniques and to be trained at different intervals. To facilitate these different training techniques the trainer 410 includes an equalizer trainer 412 and a complex gain trainer 414.

The equalizer trainer 412 is coupled to the equalizer 402 and the RF input stage (e.g., RF input stage 102, FIG. 1). As described above, the equalizer 402 is implemented with computationally intensive complex filtering techniques that can require significant time to train, and thus the equalizer trainer 412 is applied relatively rarely (e.g., only on initial setup) to train the equalizer 402 when the low IF receiver is offline or otherwise not being used for receiving RF signals.

Thus, when the low IF receiver is not being used for receiving RF signals the equalizer trainer 412 can generate a training signal and apply that training signal to the input stage of the low IF receiver front end. As one example, the training signal can be generated by an auxiliary phase locked loop in the equalizer trainer 412 and then provided to a low noise amplifier (LNA) in the RF input stage. At the same time the main input to the LNA can be set to a high impedance such that only the training signal is amplified by the LNA. The effects of this amplified training signal will then propagate through the low IF receiver front end (e.g., through the I-Q mixer 104, ADC 106) until they reach the corrector (e.g., corrector 108, 400). There, the training signal can be used to train the equalizer 402.

The training procedure performed by the equalizer trainer 412 can closely track the procedure performed by the predictor trainer 212 that was described above. However, in this embodiment a result of the training signal is extracted from an internal input of the equalizer 402 and both the training signal and the extracted result of the training signal are both saved to use in training.

Specifically, the training signal is again applied to the RF input stage. The result of the training signal propagating through the RF input stage is then extracted at an internal input to the equalizer 402. For example, the result of training signal at the internal input to the equalizer 402 can be sampled through lab instrumentation or reproduced synthetically. The training signal and the result of the training signal at the internal input to the equalizer are both saved off-line. Second, the saved training signal and the saved result of the training signal are then filtered with a high order filter to de-emphasize the components at the +IF location. Third, the saved training signal and saved result of the training signal can then be used to determining the coefficients of the complex filter response equation, as was described above. For example, the complex coefficients can be determined with a least-squares fit using the saved results of the training signal at the equalizer input as an input to the least-squares fit, and using the saved training signal as an output to the least squares fit. Likewise, the time offset value can be optimized with trial and error by doing the least-squares fit for several values choosing the offset value gives the best performance overall.

In this embodiment the complex gain trainer 414 can function in the same manner as the complex gain trainers 214 and 300 described above. Specifically, the complex gain trainer 414 is similarly coupled to the complex gain adjuster 406 and the output of the image canceller 408. As described above, the complex gain adjuster 406 is implemented to use less computationally intensive gain adjustment techniques and can train much faster and more often. This allows the complex gain adjuster 406 to adjust and optimize the cancellation signal in response to changes due to temperature and aging. It should be noted that the complex gain adjuster 406 is thus trained only after the equalizer 402 has been trained. Thus, the complex gain adjuster 406 can be used to maintain the cancellation signal near optimal with environmental changes while the equalizer 402 values predict intrinsic behavior that does not need as much adaptation.

As one specific example, the complex gain trainer 414 can be implemented with a squaring function 302, gain function 304, and accumulator 306, as was described above with reference to FIG. 3. In this embodiment the complex gain trainer 414 can operate by receiving a feedback of the corrected complex digital signal from the image canceller 408 and squaring this corrected complex digital signal in the complex domain. The squared corrected complex digital signal is then accumulated by the accumulator while the gain function controls the adaptation rate of this accumulation. The result of this accumulation thus can be used to set the gain of the complex gain adjuster 406 to more accurately generate a cancellation signal for image of the −IF blocking signal.

Thus, the corrector 400 can be implemented and trained to at least partially cancel an image of a blocking signal in the complex digital signal by generating an appropriate cancellation signal. And thus the corrector 400 can provide improved performance in low IF receivers by reducing signal distortions caused by I-Q imbalance and thus increase the signal-to-noise and distortion ratio (SNDR).

Figure 5:
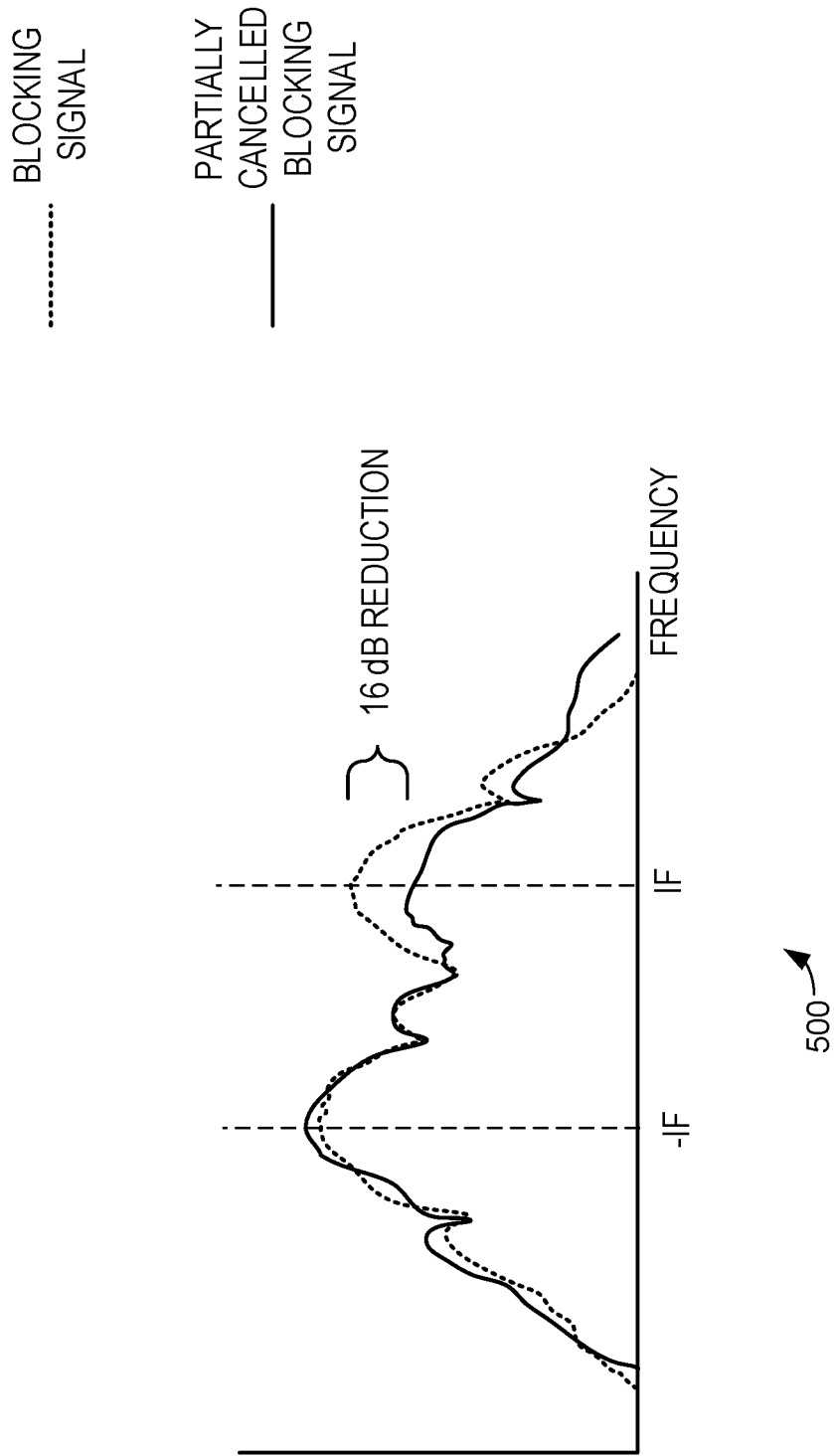
FIG. 5 shows a graphical representation of a blocking signal and a partially cancelled blocking signal in accordance with an embodiment.
Figure 6:
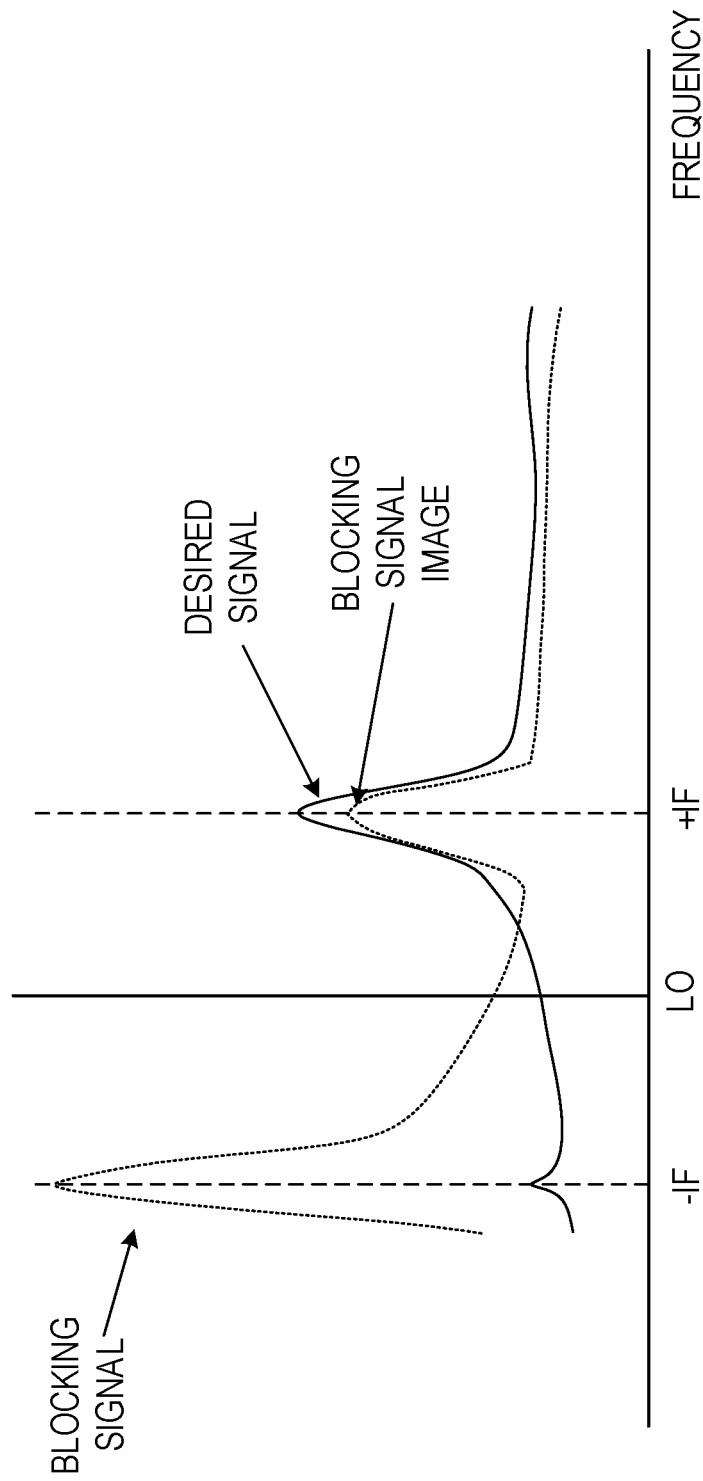
FIG. 6 shows a graphical representation of a desired signal and a blocking signal.

Turning now to FIG. 5, a graph 500 illustrates an exemplary frequency response graph of an exemplary blocking signal before and after blocking signal cancellation using a corrector as described herein (e.g., corrector 108, 200, 400). As can be seen in graph 500, the corrector is effectively cancelling at least part of an image of a blocking signal at the IF location. Specifically, in this example the corrector is able to achieve approximately 16 dB of reduction in the image of the blocking signal at the IF location. Again, such a reduction can significantly increase the signal-to-noise and distortion ratio (SNDR) of the signals received by the low IF receiver.

In some embodiments it can be desirable provide the ability to selectively enable and disable the corrector (e.g., corrector 108, 200, 400) in response to different wireless scenarios. For example, in some implementations it can be desirable to turn on a corrector to produce a cancellation signal only when certain types of unwanted signals are present over the air. Specifically, because a corrector can sometimes introduce artifacts into the corrected digital signal it can be desirable to only operate the corrector only when the specific unwanted signals the corrector is implemented to cancel are present.

For example, in some implementations a corrector (e.g., corrector 108, 200, 400) that has been trained to cancel a blocking signal at the image of the IF location (i.e., a blocking signal at the −IF location) can introduce unwanted artifacts in the corrected complex digital signal if the corrector is active when there is no blocking signal at that frequency. This can also be true even when there are blocking signals at other nearby frequencies (e.g., at the −2 IF location, −3 IF location etc.). For all these reasons it can be desirable in some applications to provide the ability to selectively enable and disable the operation of the corrector depending on whether a blocking signal is present at the −IF location.

To facilitate this selective enabling of the corrector a corrector controller can be provided. In general, the corrector controller can be configured to selectively enable the corrector when certain operational conditions are met. For example, the corrector controller can be configured to detect the presence of certain problematic signals and only enable the corrector when those problematic signals are detected.

In one embodiment, the corrector controller can be configured to determine measures of power at an image frequency range around the image of the IF and at a wideband frequency range and to selectively enable the corrector based at least in part on those determinations. Specifically, the corrector controller can be configured to selectively enable the corrector based at least in part on a first measure of power in the complex digital signal (I+jQ) at an image frequency range and a second measure of power in the corrected complex digital signal (I+jQ) at a wideband frequency range. In one embodiment the difference between the first measure of power and the second measure of power is determined and compared to one or more threshold values to determine when the corrector is enabled and disabled.

Figure 7:
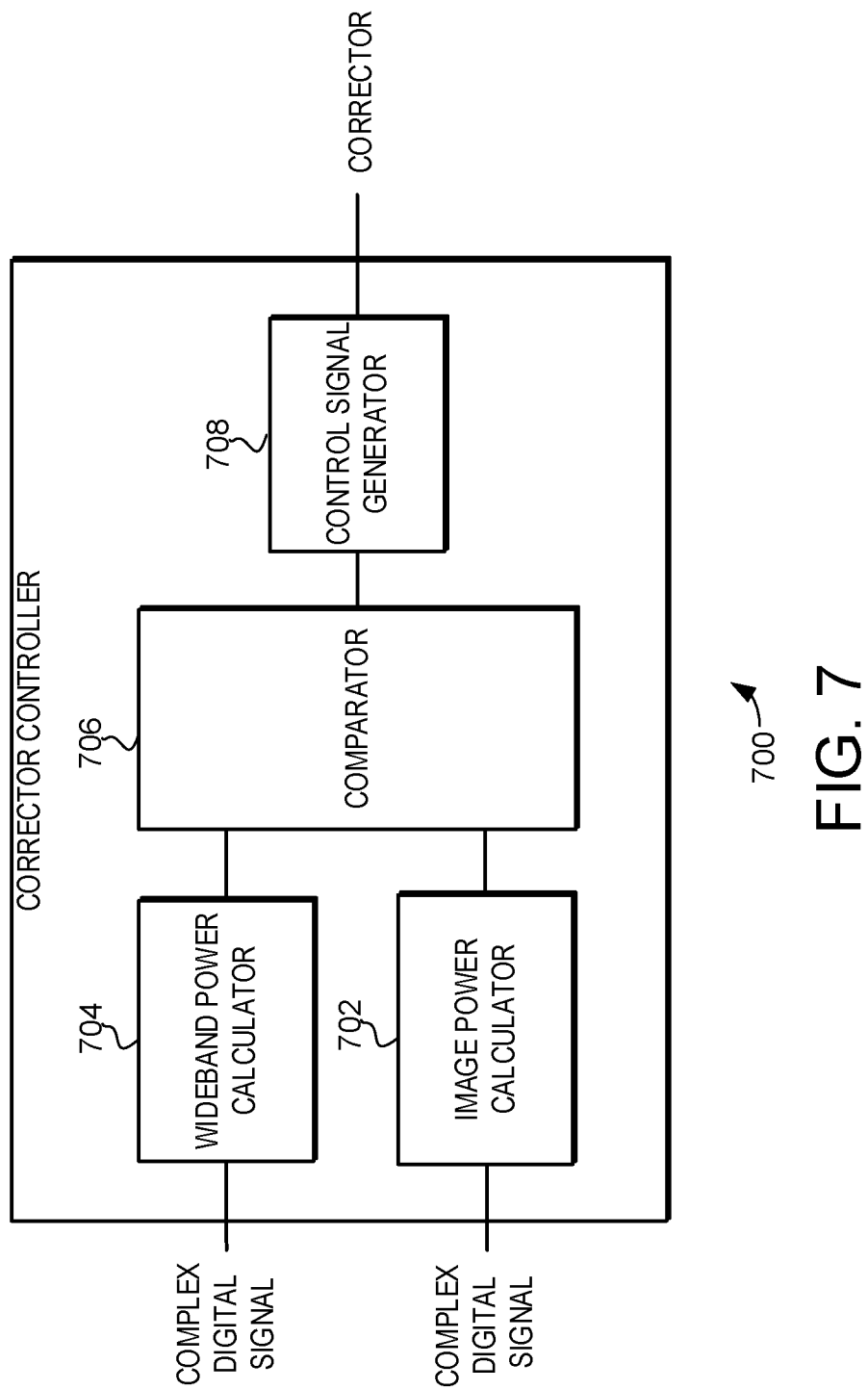
FIG. 7 shows a schematic diagram of a corrector controller in accordance with another embodiment.

Turning now to FIG. 7, a schematic diagram of an exemplary corrector controller 700 is illustrated. The corrector controller 700 includes an image power calculator 702, a wideband power calculator 704, a comparator 706, and a control signal generator 708. In general, the corrector controller 700 is configured to selectively enable the corrector based at least in part on a first measure of power determined by the image power calculator 702 and a second measure of the power determined by the wideband power calculator 704. Specifically, the difference between the first measure of power and the second measure of power is determined by the comparator 706, and this difference is used by the control signal generator 708 to determine when to enable and disable the corrector.

The image power calculator 702 is configured to receive an uncorrected digital signal generate a first measure of power in the complex digital signal at an image frequency range around an image frequency of the low intermediate frequency. As one example, the image power calculator 702 can be configured to determine a measure of power at a frequency range approximately equal to the signal bandwidth and centered at the image of the intermediate frequency (i.e., at the −IF location).

As will be described in greater detail below, the power at such an image frequency of the IF is indicative of the presence or absence of a blocking signal at the −IF location. A variety of different types of devices can be used to determine such a first measure of power. In one example, magnitude detector and an averaging filter are used to determine the first measure of power. In this example the magnitude detector serves to determine a magnitude of the mixed complex digital signal and the averaging filter serves to average the determined magnitudes. A detailed example of such an image power calculator 702 will be described in greater detail below with reference to FIG. 8.

The image power calculator 702 can receive the uncorrected digital signal from various points in the low IF receiver front end. For example, the image power calculator 702 can be coupled to the input of the corrector. As will be described in greater detail below, the implementation of the image power calculator 702 can vary depending upon where this uncorrected complex digital signal is received from.

The wideband power calculator 704 is configured to receive a complex digital signal generate a second measure of power in the corrected complex digital signal at a wideband frequency range. As will be described in greater detail below, the power such a wideband frequency range can be used as baseline of comparison to determine the presence or absence of a blocking signal at the −IF location. As one example, the wideband power calculator 704 can be configured to determine a measure of power at a wideband frequency range approximately equal to +/−3 times the intermediate frequency (i.e., +/−3IF). In one such example the image frequency range has a value of less than 3 MHz wherein the wideband frequency range has a value of at least six times the intermediate frequency.

Again, a variety of different types of devices can be used to determine such a second measure of power. In one example, magnitude detector and an averaging filter are used to determine the second measure of power. In this example the magnitude detector serves to determine a magnitude of the mixed corrected complex digital signal and the averaging filter serves to average the determined magnitudes. A detailed example of such a wideband power calculator 704 will be described in greater detail below with reference to FIG. 9.

The wideband power calculator 704 can receive the complex digital signal from various points in the low IF receiver front end. For example, the wideband power calculator 704 can be coupled to the output of the corrector. In that case the complex digital signal is a corrected complex digital signal. In other embodiments, the wideband power calculator 704 can be coupled to the input of the corrector. In that case the complex digital signal is an uncorrected complex digital signal.

The comparator 706 is configured to compare the first measure of power and the second measure of power. As such, the comparator 706 can be implemented with any suitable digital comparator, including digital logic comparators. In one embodiment the output of the comparator 706 is a digital value in dB representing the difference between the first measure of power and the second measure of power. This digital value in dB can then be passed to the control signal generator 708 and used determine when the corrector is enabled and disabled.

The control signal generator 708 is configured to receive the output of comparator 706 and determine when the corrector is enabled and disabled from that output. In one embodiment, the control signal generator 708 can be configured to selectively enable the corrector by and comparing the power difference to a first threshold value and enabling the corrector when the power difference is beyond that threshold value. Such a condition can indicate that significant power is in the image frequency range and/or is being removed by the operation of the corrector. And this condition is highly indicative of a blocking signal being present at the −IF location.

As one example embodiment the control signal generator 708 can be configured to enable the corrector when the first power measure is at least 3 dB greater than the second power measure.

In another embodiment, the control signal generator 708 can be configured to selectively enable the corrector by comparing the power difference to a first threshold value and enabling the corrector when the power difference moves above the first threshold value and disabling the corrector when the power difference is moves below the second threshold value. In such an embodiment the use of two different threshold values can provide hysteresis in the enabling and disabling of the corrector. This hysteresis can prevent undesirable chatter in the enabling and disabling of the corrector.

As one example, the control signal generator 708 can be configured to enable the corrector when the power differences moves beyond at least 3 dB and then disable the corrector only when the power difference drops below 1 dB. Again, the use of such two different threshold values can provide hysteresis in the enabling and disabling of the corrector and thus prevent undesirable chatter.

Figure 8:
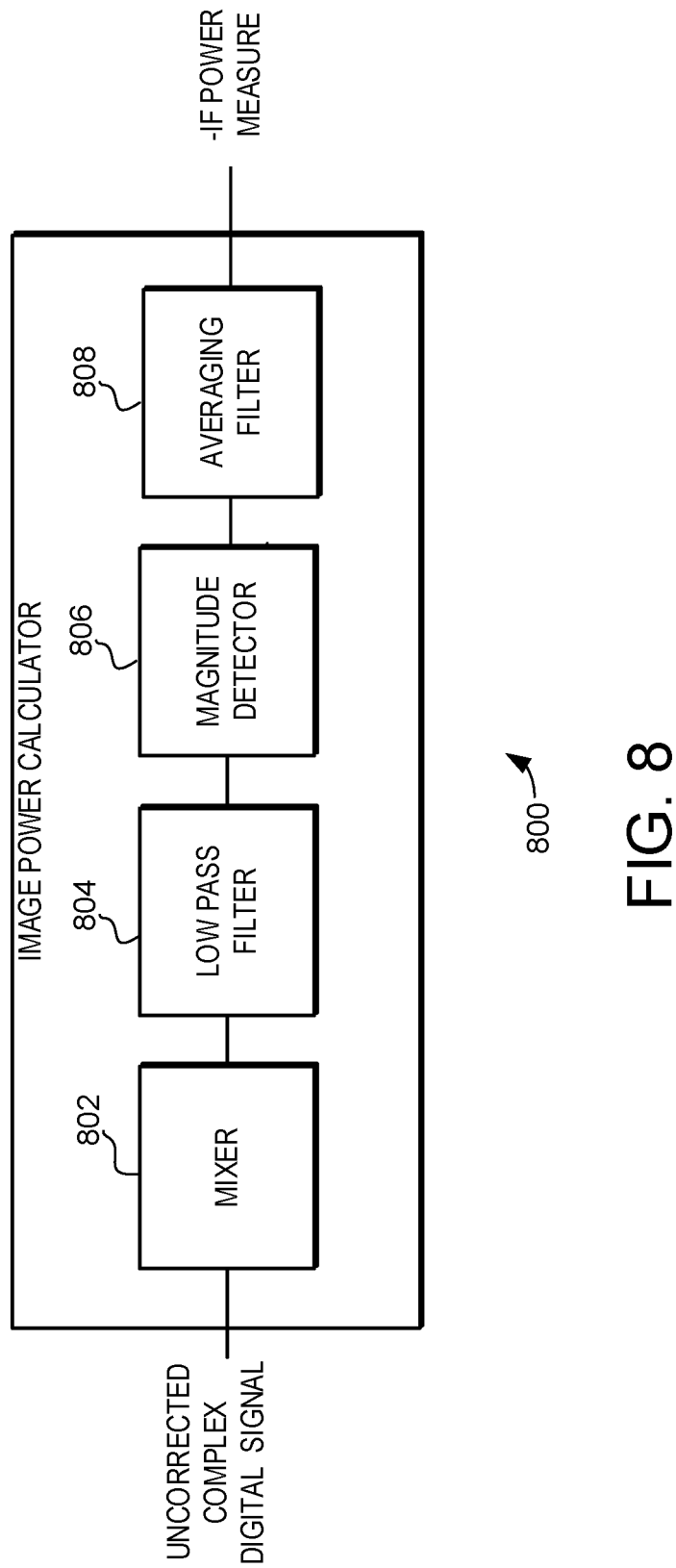
FIG. 8 shows a schematic diagram of an image power calculator in accordance with another embodiment.

Turning now to FIG. 8, an exemplary image power calculator 800 is illustrated schematically. In general, the image power calculator 800 is configured to generate a first measure of power in the image frequency range of the complex digital signal (I+jQ). To facilitate this the image power calculator 800 includes a mixer 802, a low pass filter 804, a magnitude detector 806 and an averaging filter 808.

The mixer 802 is configured to receive the uncorrected complex digital signal and down mix signals from the image frequency range that can contain −IF blocking signals to the baseband frequency. As such, the mixer 802 can be implemented with any suitable digital mixer, such as a quadrature digital mixer. It should be noted that the mixer 802 can be configured to receive the uncorrected complex digital signals from a variety of different locations on the low IF receiver, and that the amount of frequency shift needed to shift the −IF blocking signals to the baseband would depend upon the location the signals are obtained from. For example, in the corrector 200 of FIG. 2 the uncorrected complex digital signal can be obtained from before or after the complex conjugate operator 202. And because the complex conjugate operator 202 changes the frequency distribution of the signal, the amount of frequency shift needed to shift the −IF blocking signals to baseband would be different for signals received from those two different places. Thus, by implementing the appropriate mixing parameters the mixer 802 can be configured to shift signals originating in the image frequency range that can contain −IF blocking signals to the baseband frequency.

The output of the mixer 802 is coupled to the low pass filter 804. In general, the low pass filter 804 is configured to reduce the bandwidth of the down mixed complex digital signal to facilitate sub-rate sampling of the complex digital signal. As such, the low pass filter 804 can be implemented with any suitable digital low pass filter that facilitates sampling. In one embodiment, the low pass filter 804 can be implemented with a digital "integrate and dump" method that integrates the incoming digital signal and outputs the integrating result after a time interval while resetting the integrator. This process is repeated to generate a stream of averaged complex digital signal values that provide a decimated rate of information.

The output of the low pass filter 804 is coupled to the magnitude detector 806. The magnitude detector 806 determines the magnitude of the filtered complex digital signal values. It should be noted that the power measurement does not generally require a precise determination of signal magnitude. As such, it can be desirable to use a moderately accurate but relatively fast digital magnitude detector. Thus, the magnitude detector 806 can be implemented with any suitable digital magnitude approximation or other determination technique. For example, the digital magnitude detector can be implemented to use a technique where the magnitude |I+jQ| is approximated as:

$$|I + jQ| \cong \max\{I, Q\} + \frac{3}{8}\min\{I, Q\}$$

where I and Q are the in-phase and quadrature components.

The output of the magnitude detector 806 is coupled to the averaging filter 808. In general, the averaging filter 808 determines a running average of the magnitude of the filtered complex digital signal values. This running average of the magnitudes can then be used as a first measure of power in the image frequency range of the complex digital signal (I+jQ). A variety of different types of digital filters can be used to implement the averaging filter 808. In one example a single pole digital filter can be used. More specifically, an infinite impulse response (IIR) digital filter can be used. And again, the output of the such an IIR filter is the running average of the magnitude of the filtered complex digital signal values that can be passed to a comparator (e.g., comparator 706 in FIG. 7) and used as a first measure of power in the image frequency range.

Figure 9:
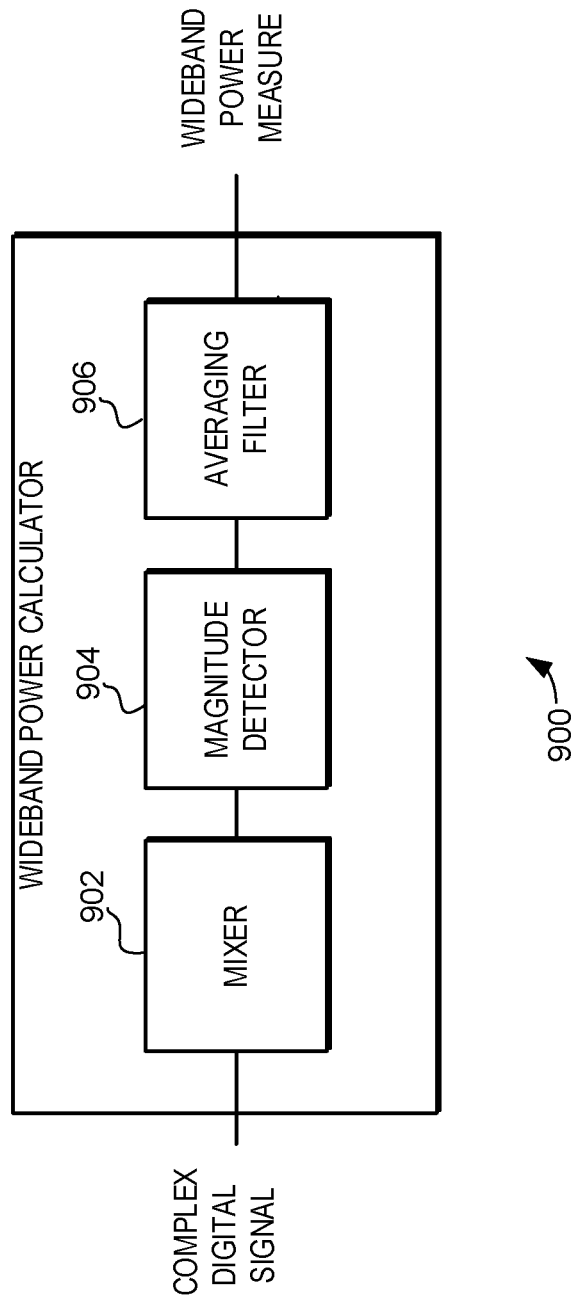
FIG. 9 shows a schematic diagram of a wideband power calculator in accordance with another embodiment.

Turning now to FIG. 9, an exemplary wideband power calculator 900 is illustrated schematically. In general, the wideband power calculator 900 is configured to generate a second measure of power in the wideband frequency range of the complex digital signal (I+jQ). To facilitate this the wideband power calculator 900 includes a mixer 902, a magnitude detector 904 and an averaging filter 906.

The wideband power calculator 900 is configured to receive the complex digital signal. As noted above, this complex digital signal can be a corrected or uncorrected signal. Thus, in one embodiment, the mixer 902 uses corrected signals, and thus it receives signals from the output of the corrector (e.g., at the output of corrector 108, 200, 400). Thus in this embodiment the mixer 902 would receive signals that have already been mixed with the generated cancellation signal (e.g., after the output image canceller 208 in FIG. 8). In other embodiments, the mixer 902 uses uncorrected signals, and thus can receive signals from the input to the corrector (e.g., at the input of corrector 108, 200, 400) or from other locations.

In either case the mixer 902 is configured to down mix the received complex digital signal to the baseband frequency. As such, the mixer 902 can be implemented with any suitable quadrature digital mixer. For example, the quadrature digital mixer can multiply the incoming signal s(t) by:

$$\exp(j2\pi ft)$$

to achieve mixing to the baseband frequency, where f is the mixing frequency and t is time.

The output of the mixer 902 is coupled to the magnitude detector 904. The magnitude detector 904 again determines the magnitude of the filtered complex digital signal values. It should again be noted that the power measurement does not generally require a precise determination of signal magnitude. As such, it can be desirable to use a moderately accurate but relatively fast digital magnitude detector. Thus, the magnitude detector 904 can again be implemented with any suitable digital magnitude technique.

The output of the magnitude detector 806 is coupled to the averaging filter 906. In general, the averaging filter 906 again determines a running average of the magnitude of the filtered complex digital signal values. This running average of the magnitudes can then be used as a second measure of power in a wideband frequency range of the corrected complex digital signal (I+jQ) at the wideband frequency range. Again, a variety of different types of digital filters can be used to implement the averaging filter 906. In one example a single pole digital filter can be used. More specifically, an infinite impulse response (IIR) digital filter can be used. And again, the output of the such an IIR filter is running average of the magnitude of the corrected complex digital signal values that can be passed to a comparator (e.g., comparator 706 in FIG. 7) and used as a second measure of power in the wideband frequency range.

The embodiments described herein thus provide systems and methods for digital correction in low intermediate frequency (IF) receivers that can provide improved performance. Specifically, the embodiments described herein use digital correction techniques that can correct for signal distortions in low IF receivers caused by I-Q imbalance, including both I-Q magnitude imbalance and I-Q phase imbalance. In general, the embodiments described herein are implemented to at least partially cancel an image of a blocking signal in the complex digital signal. Such a cancellation can be implemented to at least partially cancel an image of blocking signal where that image occurs at or near the intermediate frequency (i.e., an image of an –IF blocking signal at occurs at the IF frequency). As such, the embodiments described herein can be applied to a wide variety of radio frequency (RF) applications and protocols as previously listed.

In one embodiment, a low intermediate frequency (IF) receiver is provided, the low IF receiver comprising: a mixer configured to be coupled to an antenna for receiving an RF signal at a fundamental frequency (f0), the mixer configured to generate I and Q signals at a low intermediate frequency from the received RF signal; an analog to digital converter configured to receive the I and Q signals and generate a complex digital signal (I+jQ), where the complex digital signal (I+jQ) includes an image of a blocking signal created by IQ imbalance in the mixer, the image of the blocking signal having a frequency at or near the low intermediate frequency; a corrector configured to receive the complex digital signal (I+jQ) and at least partially cancel the image of a blocking signal using a cancellation signal to generate a corrected complex digital signal (I+jQ); and a corrector controller configured to selectively enable the corrector based at least in part on a first measure of power in the complex digital signal (I+jQ) at an image frequency range and a second measure of power in the complex digital signal (I+jQ) at a wideband frequency range.

In another embodiment, a method of processing a received radio frequency (RF) signal is provided, comprising: mixing the received RF signal to generate I and Q signals at a low intermediate frequency; converting the and Q signals to a complex digital signal (I+jQ), where the complex digital signal (I+jQ) includes an image of a blocking signal created by IQ imbalance during the mixing, the image of the blocking signal having a frequency at or near the low intermediate frequency; training a corrector to generate a cancellation signal; and selectively enabling the corrector based at least in part on a first measure of power in the complex digital signal (I+jQ) at an image frequency range and a second measure of power in the complex digital signal (I+jQ) at a wideband frequency range, where the corrector partially cancels an image of the blocking signal using the cancellation signal when enabled.

In another embodiment, a low intermediate frequency (IF) receiver is provided, the low IF receiver comprising: a mixer configured to be coupled to an antenna for receiving an RF signal at a fundamental frequency (f0), the mixer configured to generate I and Q signals at a low intermediate frequency from the received RF signal; an analog to digital converter configured to receive the I and Q signals and generate a complex digital signal (I+jQ), where the complex digital signal (I+jQ) includes an image of a blocking signal created by IQ imbalance in the mixer, the image of the blocking signal having a frequency at or near the low intermediate frequency; a corrector configured to receive the complex digital signal (I+jQ) and at least partially cancel the image of a blocking signal using a cancellation signal to generate a corrected complex digital signal (I+jQ); a corrector controller configured selectively enable and disable the corrector, the corrector controller including: an image power calculator configured to generate a first measure of power in the complex digital signal (I+jQ) at an image frequency range; a wideband power calculator configured to generate a second measure of power in the complex digital signal (I+jQ) at a wideband frequency range; a comparator configured to compare the first measure of power and the second measure of power; and wherein the corrector controller is configured to selectively enable and disable by comparing a power difference between the first measure of power and the second measure of power to a first threshold and a second threshold, and enabling the corrector when the power difference is above the first threshold and disabling the corrector when the power difference is below the second threshold.

For the sake of brevity, conventional techniques related to signal processing, sampling, analog-to-digital conversion, digital-to-analog conversion, analog circuit design, differential circuit design, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. It should be understood that circuitry described herein may be implemented either in silicon or another semiconductor material or alternatively by software code representation thereof.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode). The foregoing description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Unless expressly stated otherwise, "coupled" means that one element is directly or indirectly joined to (or directly or indirectly communicates with) another element, and not necessarily mechanically. Thus, although the schematics shown in the figures depict exemplary arrangements of elements, additional intervening elements, devices, features, or components may be present in an embodiment of the depicted subject matter. In addition, certain terminology may also be used in the foregoing description for the purpose of reference only, and thus are not intended to be limiting.

The terms "first," "second," "third," "fourth" and the like in the description and the claims are used for distinguishing between elements and not necessarily for describing a particular structural, sequential or chronological order. It is to be understood that the terms so used are interchangeable under appropriate circumstances. Furthermore, the terms "comprise," "include," "have" and any variations thereof, are intended to cover non-exclusive inclusions, such that a circuit, process, method, article, or apparatus that comprises a list of elements is not necessarily limited to those elements, but may include other elements not expressly listed or inherent to such circuit, process, method, article, or apparatus.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A low intermediate frequency (IF) receiver, the low IF receiver comprising:
    a mixer configured to be coupled to an antenna for receiving an RF signal at a fundamental frequency ($f_0$), the mixer configured to generate I and Q signals at a low intermediate frequency from the received RF signal;
    an analog to digital converter configured to receive the I and Q signals and generate a complex digital signal (I+jQ), where the complex digital signal (I+jQ) includes an image of a blocking signal created by IQ imbalance in the mixer, the image of the blocking signal having a frequency at or near the low intermediate frequency;
    a corrector configured to receive the complex digital signal (I+jQ) and at least partially cancel the image of the blocking signal using a cancellation signal to generate a corrected complex digital signal (I+jQ); and
    a corrector controller configured to selectively enable the corrector based at least in part on a first measure of power in the complex digital signal (I+jQ) at an image frequency range and a second measure of power in the complex digital signal (I+jQ) at a wideband frequency range.

2. The low IF receiver of claim 1, wherein the corrector controller further comprises a comparator configured to compare the first measure of power and the second measure of power.

3. The low IF receiver of claim 1, wherein the corrector controller is configured to selectively enable the corrector based at least in part on the first measure of power in the complex digital signal (I+jQ) at the image frequency range and the second measure of power in the complex digital signal (I+jQ) at the wideband frequency range by determining a power difference and comparing the power difference to a first threshold.

4. The low IF receiver of claim 1, wherein the corrector controller is configured to selectively enable the corrector based at least in part on the first measure of power in the complex digital signal (I+jQ) at the image frequency range and the second measure of power in the complex digital signal (I+jQ) at the wideband frequency range by determining a power difference and comparing the power difference to a first threshold and a second threshold, and wherein the corrector controller is configured to enable the corrector when the power difference is above the first threshold and to disable the corrector when the power difference is below the second threshold.

5. The low IF receiver of claim 4, wherein the first threshold is greater than the second threshold by at least one dB.

6. The low IF receiver of claim 1, wherein the image frequency range is a range of less than 3 MHz and wherein the wideband frequency range has is a range of at least six times the intermediate frequency.

7. The low IF receiver of claim 1, wherein the corrector controller further comprises:
    an image power calculator configured to generate the first measure of power in the complex digital signal (I+jQ) at the image frequency range; and
    a wideband power calculator configured to generate the second measure of power in the complex digital signal (I+jQ) at the wideband frequency range.

8. The low IF receiver of claim 7, wherein the image power calculator comprises:
    a mixer configured to mix the complex digital signal (I+jQ) at the image frequency range to a baseband frequency;
    a low pass filter configured to filter the mixed complex digital signal (I+jQ);

a magnitude detector configured to determine a magnitude of the mixed complex digital signal (I+jQ); and a first averaging filter configured to average the determined magnitude of the mixed complex digital signal (I+jQ).

9. The low IF receiver of claim 8, wherein the low pass filter comprises an integrate and dump function and wherein the first averaging filter comprises an infinite impulse response (IIR) filter.

10. The low IF receiver of claim 8, wherein the mixer is coupled to an input of a complex conjugate operator to receive the complex digital signal (I+jQ).

11. The low IF receiver of claim 8, wherein the mixer is coupled to an output of a complex conjugate operator to receive the complex digital signal (I+jQ).

12. The low IF receiver of claim 7, wherein the wideband power calculator comprises:

a mixer configured to mix the complex digital signal (I+jQ) at the wideband frequency range to a baseband frequency;

a magnitude detector configured to determine a magnitude of the mixed complex digital signal (I+jQ); and a second averaging filter configured to average the determined magnitude of the mixed complex digital signal (I+jQ).

13. The low IF receiver of claim 12, wherein the second averaging filter comprises an infinite impulse response (IIR) filter.

14. The low IF receiver of claim 1, wherein the complex digital signal (I+jQ) at the wideband frequency range is the corrected complex digital signal (I+jQ).

15. The low IF receiver of claim 1, wherein the complex digital signal (I+jQ) at the wideband frequency range is the complex digital signal (I+jQ) before the cancelling of the image of the blocking signal.

16. The low IF receiver of claim 1, further comprising a trainer configured to train the corrector to generate the cancellation signal.

17. A method of processing a received radio frequency (RF) signal, comprising:

mixing the received RF signal to generate I and Q signals at a low intermediate frequency;

converting the and Q signals to a complex digital signal (I+jQ), where the complex digital signal (I+jQ) includes an image of a blocking signal created by IQ imbalance during the mixing, the image of the blocking signal having a frequency at or near the low intermediate frequency;

training a corrector to generate a cancellation signal; and selectively enabling the corrector based at least in part on a first measure of power in the complex digital signal (I+jQ) at an image frequency range and a second measure of power in the complex digital signal (I+jQ) at a wideband frequency range, where the corrector partially cancels the image of the blocking signal using the cancellation signal when enabled.

18. The method of claim 17, where the selectively enabling of the corrector based at least in part on the first measure of power in the complex digital signal (I+jQ) at the image frequency range and the second measure of power in the complex digital signal (I+jQ) at the wideband frequency range comprises determining a power difference and comparing the power difference to a first threshold.

19. The method of claim 17, where the selectively enabling of the corrector based at least in part on the first measure of power in the complex digital signal (I+jQ) at the image frequency range and the second measure of power in the complex digital signal (I+jQ) at the wideband frequency range comprises determining a power difference and comparing the power difference to a first threshold and a second threshold, and enabling the corrector when the power difference is above the first threshold and disabling the corrector when the power difference is below the second threshold.

20. A low intermediate frequency (IF) receiver, the low IF receiver comprising:

a mixer configured to be coupled to an antenna for receiving an RF signal at a fundamental frequency ($f_0$), the mixer configured to generate I and Q signals at a low intermediate frequency from the received RF signal;

an analog to digital converter configured to receive the I and Q signals and generate a complex digital signal (I+jQ), where the complex digital signal (I+jQ) includes an image of a blocking signal created by IQ imbalance in the mixer, the image of the blocking signal having a frequency at or near the low intermediate frequency;

a corrector configured to receive the complex digital signal (I+jQ) and at least partially cancel the image of the blocking signal using a cancellation signal to generate a corrected complex digital signal (I+jQ);

a corrector controller configured selectively enable and disable the corrector, the corrector controller including:

an image power calculator configured to generate a first measure of power in the complex digital signal (I+jQ) at an image frequency range;

a wideband power calculator configured to generate a second measure of power in the complex digital signal (I+jQ) at a wideband frequency range;

a comparator configured to compare the first measure of power and the second measure of power; and wherein the corrector controller is configured to selectively enable and disable by comparing a power difference between the first measure of power and the second measure of power to a first threshold and a second threshold, and enabling the corrector when the power difference is above the first threshold and disabling the corrector when the power difference is below the second threshold.

\* \* \* \* \*